United States Patent

Happoya

[11] Patent Number: 6,084,780
[45] Date of Patent: Jul. 4, 2000

[54] PRINTED CIRCUIT BOARD WITH HIGH ELECTRONIC COMPONENT DENSITY

[75] Inventor: Akihiko Happoya, Ome, Japan

[73] Assignee: Kabushiki Kaisha Toshiba, Kawasaki, Japan

[21] Appl. No.: 08/945,539

[22] PCT Filed: Jan. 28, 1997

[86] PCT No.: PCT/JP97/00179

§ 371 Date: Oct. 2, 1997

§ 102(e) Date: Oct. 2, 1997

[87] PCT Pub. No.: WO97/29621

PCT Pub. Date: Aug. 14, 1997

[30] Foreign Application Priority Data

Feb. 6, 1996 [JP] Japan .................................. 8-019898

[51] Int. Cl.[7] ........................................................ H05K 7/06
[52] U.S. Cl. .......................... 361/767; 361/749; 361/761; 361/803; 257/686; 257/723; 257/777
[58] Field of Search .................................. 174/52.4, 254; 257/686, 778, 723, 724, 777; 361/735, 744, 749, 790, 761, 763, 764, 767, 768, 803; 439/68, 69

[56] References Cited

U.S. PATENT DOCUMENTS

| | | | |
|---|---|---|---|
| 4,982,265 | 1/1991 | Watanabe et al. | 257/686 |
| 5,061,990 | 10/1991 | Arakawa et al. | 257/676 |
| 5,290,971 | 3/1994 | Hamaguchi et al. | 174/254 |
| 5,307,241 | 4/1994 | Pistilli | 361/784 |
| 5,334,875 | 8/1994 | Sugano et al. | 257/686 |
| 5,434,745 | 7/1995 | Shokrgozar et al. | 361/735 |
| 5,438,224 | 8/1995 | Papageorge et al. | 257/777 |
| 5,455,741 | 10/1995 | Wai et al. | 361/761 |
| 5,471,368 | 11/1995 | Downie et al. | 361/760 |
| 5,579,207 | 11/1996 | Hayden et al. | 361/764 |
| 5,770,300 | 6/1998 | Okamoto et al. | 361/749 |

FOREIGN PATENT DOCUMENTS

| | | | |
|---|---|---|---|
| 0 583 201 A1 | 2/1994 | European Pat. Off. | 257/686 |
| 0583201 | 2/1994 | European Pat. Off. | 257/686 |
| 0649 272 A1 | 4/1995 | European Pat. Off. . | |
| 0 679 051 A2 | 10/1995 | European Pat. Off. . | |
| 41 40 010 A1 | 6/1992 | Germany . | |
| 43 26 104 A1 | 2/1995 | Germany . | |
| 1-286353 | 11/1989 | Japan | 257/686 |
| 2-007598 | 1/1990 | Japan . | |
| 04 105390 | 4/1990 | Japan . | |
| 2-146792 | 6/1990 | Japan | 257/686 |
| 3-154393 | 7/1991 | Japan . | |
| 5-183103 | 7/1993 | Japan | 257/686 |

OTHER PUBLICATIONS

IBM Technical Disclosure Bulletin Dual–In–Line Package Socket "Piggyback" Stucture by McAtee vol. 16 No. 4, Sep. 1973.

2244 Research Disclosure, 31707 "Jumper for Dual Inline Packaged (DIP) Integrated Circuits," No. 317, Emsworth, GB, Sep. 1990.

*Primary Examiner*—Leo P. Picard
*Assistant Examiner*—John B. Vigushin
*Attorney, Agent, or Firm*—Finnegan, Henderson, Farabow, Garrett & Dunner, L.L.P.

[57] ABSTRACT

A printed-circuit board (10) is provided with a main printed-wiring board (12) having a first conductor pattern (16), and first electronic components (18) mounted on the main printed-wiring board and electrically connected to the first conductor pattern. Component units (22) are mounted on the main printed-wiring board. Each of the component units includes an auxiliary printed-wiring board (24) having a second conductor pattern (28), and a second electronic component (32) mounted on the auxiliary printed-wiring board and electrically connected to the second conductor pattern. Each component unit is mounted on the main printed-wiring board, covering one first electronic component (18). Each second conductor pattern is electrically connected to the first conductor pattern.

6 Claims, 4 Drawing Sheets

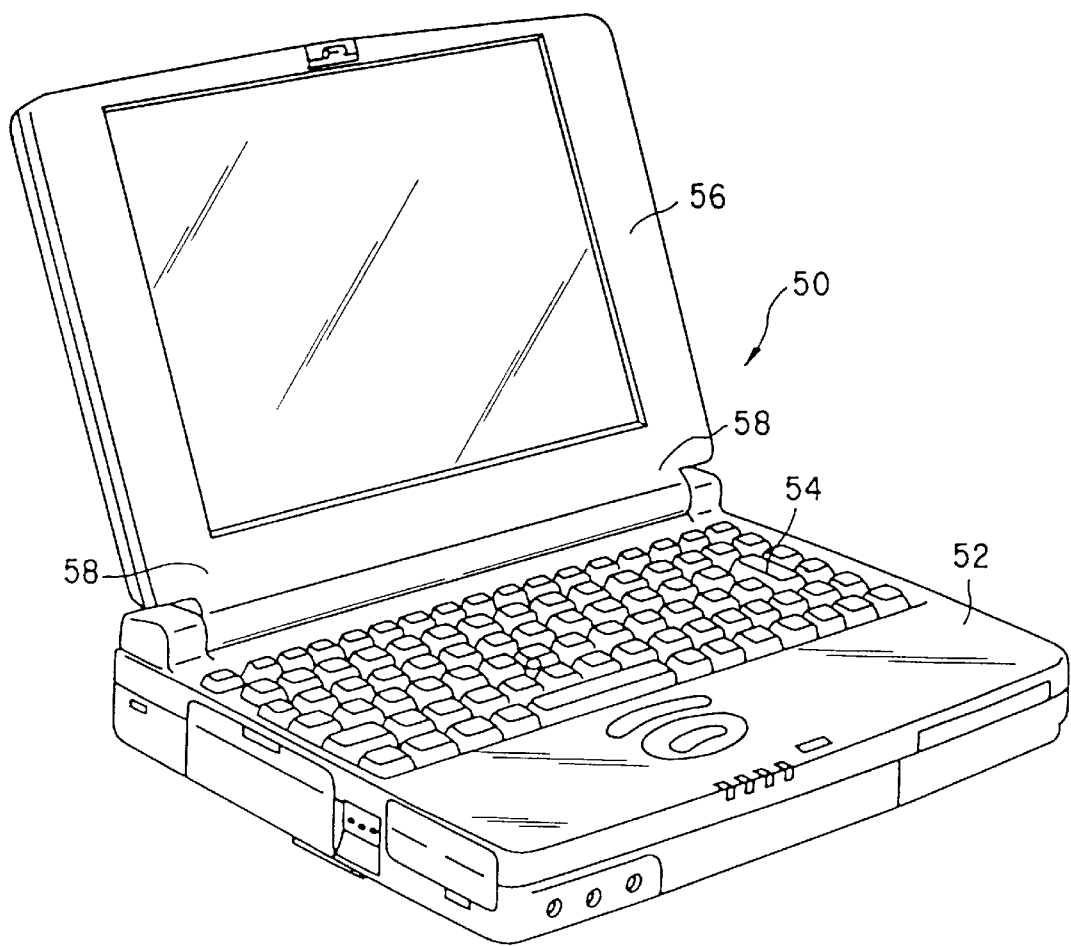
F I G. 1

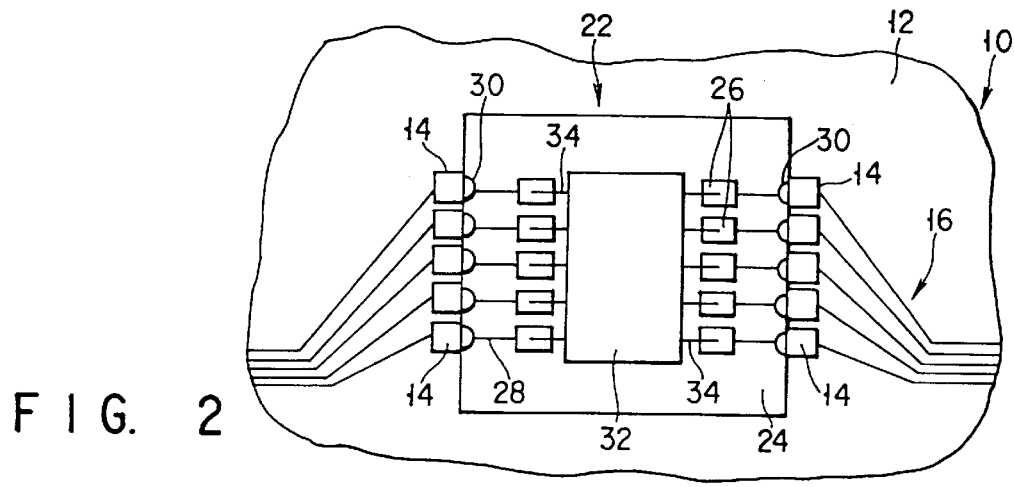
FIG. 2
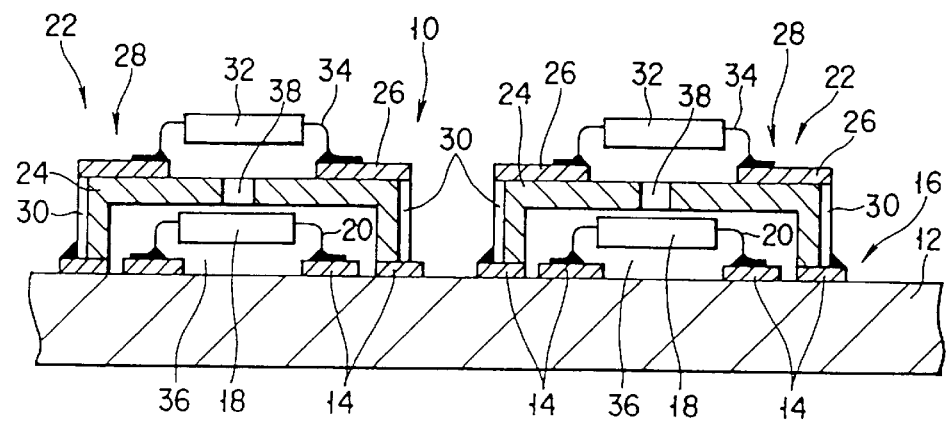
FIG. 3
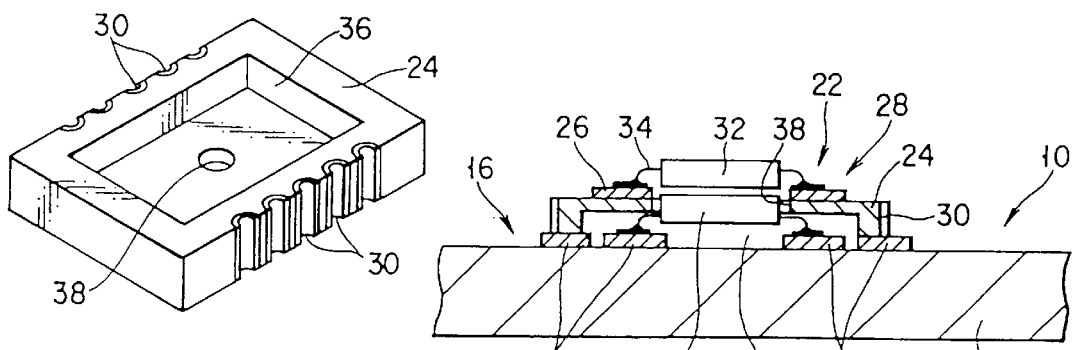
FIG. 4
FIG. 5

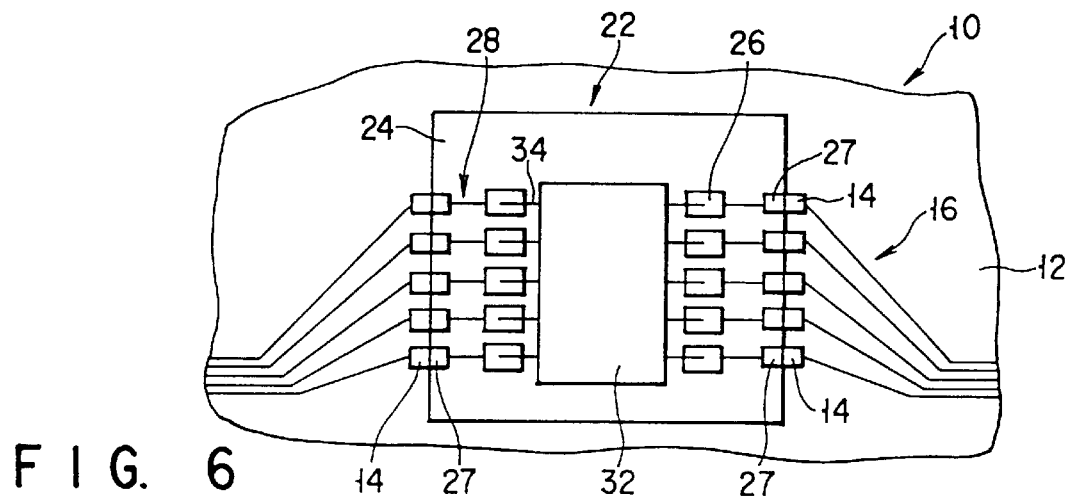
F I G. 6
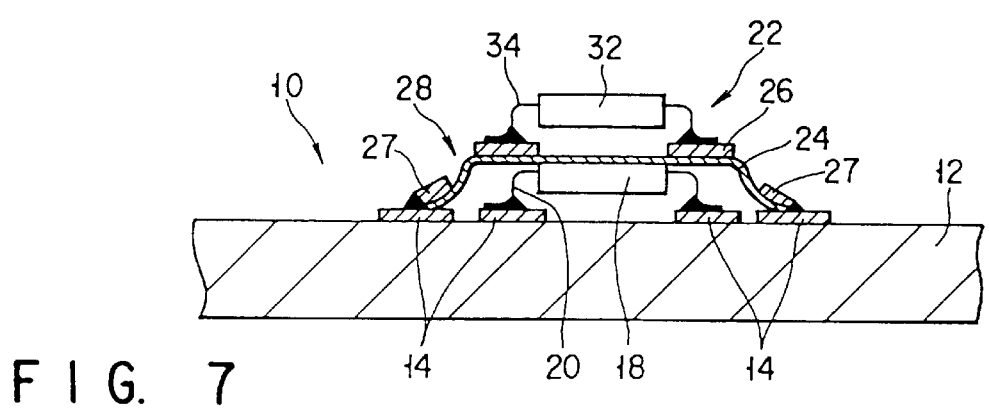
F I G. 7
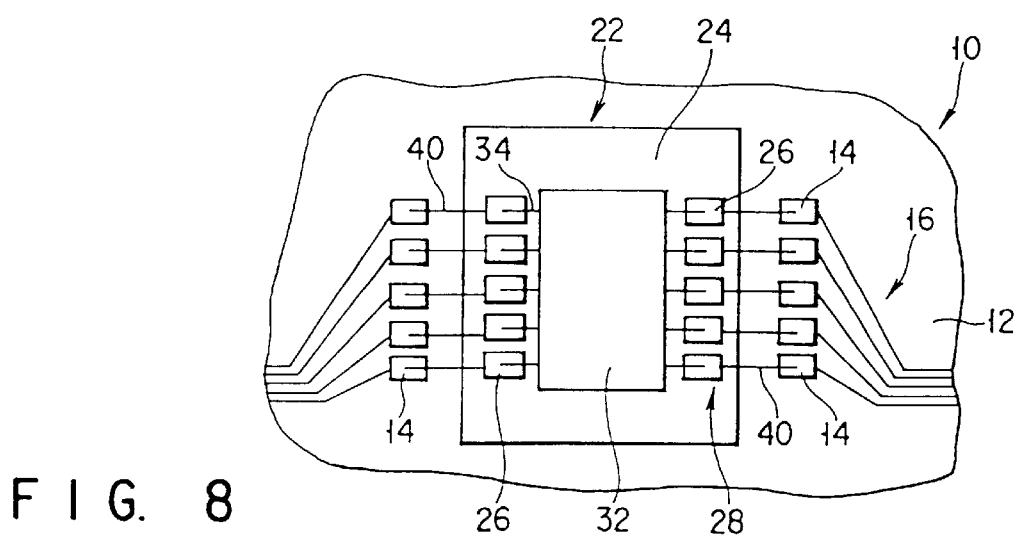
F I G. 8

PRINTED CIRCUIT BOARD WITH HIGH ELECTRONIC COMPONENT DENSITY

TECHNICAL FIELD

The present invention relates to a printed-circuit board mounted with a number of electronic components, and to an electronic apparatus provided with the printed circuit board.

BACKGROUND ART

In recent years, printed-circuit boards each comprising a printed-wiring board and a number of electronic components mounted on the board are used in increasing numbers, in electronic apparatuses such as personal computers. Generally, a printed-wiring board has a conductor pattern including a number of connection pads. Electronic components are mounted on the printed-wiring board, with their connection terminals soldered to the connection pads.

Recently, electronic apparatuses are made smaller and designed to have better performance. Printed-circuit boards for use in these apparatuses must therefore be small and must acquire high performance.

The smaller a printed-circuit board, the smaller its area. Nonetheless, more electronic components must be mounted to achieve higher performance. There is a limit to the density at which electronic components can be mounted. Thus it is difficult, in some cases, to mount all required components on the printed-wiring board. If so, it is impossible to miniaturize the printed-circuit board any more.

DISCLOSURE OF THE INVENTION

The present invention has been made in view of the foregoing, and its object is to provide a printed-circuit board which has electronic components mounted at a high density and which is smaller than conventional ones, and to provide an electronic apparatus provided with the same.

To attain the object mentioned above, a printed-circuit board according to the invention comprises: a main printed-wiring board having a first conductor pattern; a first electronic component mounted on the main printed-wiring board and electrically connected to the first conductor pattern; an auxiliary printed-wiring board mounted on the main printed-wiring board, covering the first electronic component, and having a second conductor pattern electrically connected to the first conductor pattern; and a second electronic component mounted on the auxiliary printed-wiring board and electrically connected to the second conductor pattern.

A printed-circuit board according to the invention comprises: a main printed-wiring board having a first conductor pattern; a first electronic component mounted on the main printed-wiring board and electrically connected to the first conductor pattern; and a component unit including an auxiliary printed-wiring board having a second conductor pattern, and a second electronic component mounted on the auxiliary printed-wiring board and electrically connected to the second conductor pattern. The component unit is mounted on the main printed-wiring board, covering the first electronic component, and the second conductor pattern is electrically connected to the first conductor pattern.

As described above, the auxiliary printed-wiring board on which the second electronic component is arranged, covering the first electronic component. The first and second electronic components are thus mounted in three-dimensional fashion. Hence, many electronic components can be mounted at a high density.

Moreover, an electronic apparatus according to the present invention comprises: a housing; input means provided on the housing, for inputting information; display means provided on the housing, for displaying information; and a printed-circuit board arranged in the housing. The printed-circuit board includes: a main printed-wiring board having a first conductor pattern; a first electronic component mounted on the main printed-wiring board and electrically connected to the first conductor pattern; an auxiliary printed-wiring board mounted on the main printed-wiring board, covering the first electronic component, and having a second conductor pattern electrically connected to the first conductor pattern; and a second electronic component mounted on the auxiliary printed-wiring board and electrically connected to the second conductor patterns.

BRIEF DESCRIPTION OF DRAWINGS

FIG. 1 is a perspective view showing a personal computer provided with a printed-circuit board according to a first embodiment of the present invention, FIG. 2 is a plan view illustrating the printed-circuit board, FIG. 3 is a sectional view of the printed-circuit board, and FIG. 4 is a perspective view showing the bottom of a component unit included in the printed-circuit board;

FIG. 5 is a sectional view of a printed-circuit board which is a modification of the first embodiment;

FIG. 6 is a plan view showing a part of a printed-circuit board according to a second embodiment of the present invention;

FIG. 7 is a sectional view of the printed-circuit board according to the second embodiment;

FIG. 8 is a plan view showing a part of a printed-circuit board which is a modification of the second embodiment;

BEST MODE OF CARRYING OUT THE INVENTION

Figure 9:
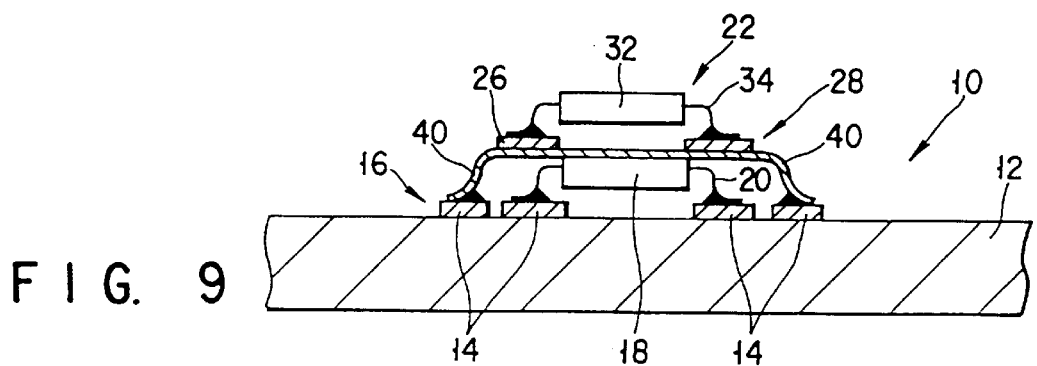
FIG. 9 is a sectional view of the printed-circuit board which is the modification of the second embodiment.

A first embodiment of this invention will now be described in detail, with reference to the accompanying drawings.

FIG. 1 shows a portable personal computer 50 provided with a printed-circuit board according to the present invention. The personal computer 50 comprises a rectangular box-like housing 52. A keyboard 54 serving as input means is provided on an upper surface of the housing 52. A display unit 56 having a liquid crystal display panel is rotatable mounted on the rear end portion of the housing 52 by means of a hinge portion 58. In the housing 52 are arranged a number of electronic components such as a printed-circuit board (described later), a memory device (not shown), a battery pack, and the like.

As shown in FIGS. 2 to 4, a printed-circuit board 10 according to the first embodiment of the invention has a main printed-wiring board 12. Formed on a surface of the main printed-wiring board 12 is a first conductor pattern 16 which includes a number of connection pads 14. First electronic components 18 of various types are mounted on the main printed-wiring board 12.

Each of the first components 18 has a plurality of connection terminals 20. The connection terminals 20 of the components 18 are soldered to the connection pads 14 and are, hence, electrically connected to the first conductor pattern 16.

A plurality of component units 22 are mounted on the main printed-wiring board 12. Each component unit 22 is large, covering one electronic component 18. More specifically, each component unit 22 has an auxiliary printed-wiring board 24 which is substantially rectangular and which has a thickness of, for example, about 1.6 mm. The auxiliary printed-wiring board 24 is a so-called rigid printed-wiring board, comprising a hard base plate and a second conductor pattern 28 formed on the base plate. The second conductor pattern 28 includes a plurality of connection pads 26.

The second conductor pattern 28 has a plurality of wires 30 which are provided on two opposite side faces of the auxiliary printed-wiring board 28 and which extend to the lower surface of the auxiliary printed-wiring board. Each of the wires 30 has been formed by cutting the base plate along the diameter of a plated through hole formed in the base plate.

Second electronic components 32 are mounted on the auxiliary printed-wiring boards 24, respectively. Each second component 32 has a plurality of connection terminals 34. These connection terminals 34 are soldered to the connection pads 26, respectively, and hence are electrically connected to the second conductor pattern 28. Each auxiliary printed-wiring board 24 has a recess 36 in the lower surface, storing one first electronic component 18. In other words, each auxiliary printed-wiring board 24 has four legs extending downwards from the four sides, respectively.

The component units 22 thus structured are mounted on the main printed-wiring board 12, covering the first electronic components 18. The wires 30 of each unit 22 are soldered to the connecting pads 14 of the main printed-wiring board 12, respectively. The second electronic component 32 of each component unit 22 is electrically connected through the second conductor pattern 28 to the first conductor pattern 16 provided on the main printed-wiring board 12. The first electronic components 18 are placed in the recesses 36 of the auxiliary printed-wiring boards 24, respectively.

Each auxiliary printed-wiring board 24 has a through hole 38 communicating the recess 36. The through hole 38 facilitates the deaeration of the recess 38 and the heat transmission into the recess 38 during reflow soldering. The through hole 38 also functions to radiate heat from the first electronic component 18 while the printed-circuit board 10 is operating. Each auxiliary printed-wiring board 24 may have, if necessary, two or more through holes 38, instead of one.

In the printed-circuit board 10 thus constructed, the component units 22 are mounted on the main printed-wiring board 12, covering the respective first electronic components 18. Further, the second electronic components 32 are mounted on the auxiliary printed-wiring boards 24 of the component units 22. That is, the first and second electronic components 18 and 32 are mounted in three-dimensional fashion. Thus, the electronic components are mounted at a much increased density. The printed-circuit board 10 can therefore be made more compact.

Moreover, the component units 22 function as protect covers for the first electronic components 18 mounted on the main printed-wiring board 12. They can effectively protect the first electronic components, particularly if the first electronic components are provided in the form of a tape-carrier package (TCP).

FIG. 5 shows a modification of the first embodiment described above. In the modification, the through hole 38 formed in the auxiliary printed-wiring board 24 of each component unit 22 is large, accommodating the top portion of one first electronic component 18. Further, each component unit 22 is mounted on the main printed-wiring board 12, covering the first electronic component 18 and storing the top portion thereof in the through hole 38.

Thus constructed, the modification can achieve the same advantages as the first embodiment described above. In addition, the component units 22 can be reduced in height to render the printed-circuit board 10 thinner.

FIGS. 6 and 7 illustrate a printed-circuit board 10 according to the second embodiment of the present invention. The printed-circuit board 10 comprises a main printed-wiring board 12, a first conductor pattern 16 and first electronic components 18 of various types. The first conductor pattern 16 is formed on a surface of the main printed-wiring board 12 and includes a number of connection pads 14. The first electronic components 18 are mounted on the main printed-wiring board 12.

Each of the first components 18 has a plurality of connection terminals 20. The connection terminals 20 of the components 18 are soldered to the connection pads 14 and are, hence, electrically connected to the first conductor pattern 16. A plurality of component units 22 are mounted on the main printed-wiring board 12. Each component unit 22 is large, covering one first electronic component 18.

In the second embodiment, the auxiliary printed-wiring board 24 of each component unit 22 is a flexible printed-wiring board.

Second conductor patterns 28 are provided on the upper surfaces of the auxiliary printed-wiring boards 24, respectively, which are rectangular. Each second conductor pattern 28 has a plurality of first connecting pads 26 and a plurality of second connecting pads 27. The first connecting pads 26 are formed on the center part of the auxiliary printed-wiring board 24, whereas the second connecting pads 27 are formed on opposite two side edges of the auxiliary printed-wiring board.

Second electronic components 32 are mounted on the auxiliary printed-wiring boards 24, respectively. Each second component 31 has a plurality of connection terminals 34. These connection terminals 34 are soldered to the first connection pads 26, respectively, and hence are electrically connected to the second conductor pattern 28.

Each component unit 22 is mounted on the main printed-wiring board 12, covering one first electronic component 18. The auxiliary printed-wiring board 24 has two end portions bent downwards. The second connection pads 27 on the auxiliary printed-wiring board 24 are soldered to the respective connection pads 14 provided on the main printed-wiring board 12. Hence, the second electronic component 32 of each component unit 22 is electrically connected through the second conductor pattern 28 to the first conductor pattern 16 formed on the main printed-wiring board 12.

In the printed-circuit board 10 thus constructed, the component units 22 are mounted on the main printed-wiring board 12, covering the respective first electronic components 18. Further, the second electronic components 32 are mounted on the auxiliary printed-wiring boards 24 of the component units 22. That is, the first and second electronic components 18 and 32 are mounted in three-dimensional fashion. The electronic components are therefore mounted at a much increased density. As a result, the printed-circuit board 10 can be made more compact.

FIGS. 8 and 9 show a printed-circuit board 10 which is a modification of the second embodiment. The modification differs from the second embodiment in that no second connection pads are provided on the auxiliary printed-wiring board 24 of each component unit 22. Instead, the wires of each second conductor pattern 28 extend from two opposing side edges of the auxiliary printed-wiring board, forming lead-shaped terminals 40.

The component units 22 are mounted on the main printed-wiring board 12, covering the first electronic components 18. The connection terminals 40 are soldered to the connection pads 14 provided on the main printed-wiring board 12. The component units 22 are thereby electrically connected to the first conductor pattern 16.

Thus constructed, the modification can achieve the same advantages as the second embodiment described above. Furthermore, the lead-shaped connection terminals 40 make it easy to connect the component units 22 to the main printed-wiring board 12.

The present invention is not limited to the embodiments and the modifications thereof, all described above. Rather, various changes can be made within the scope of the invention.

Figure 10:
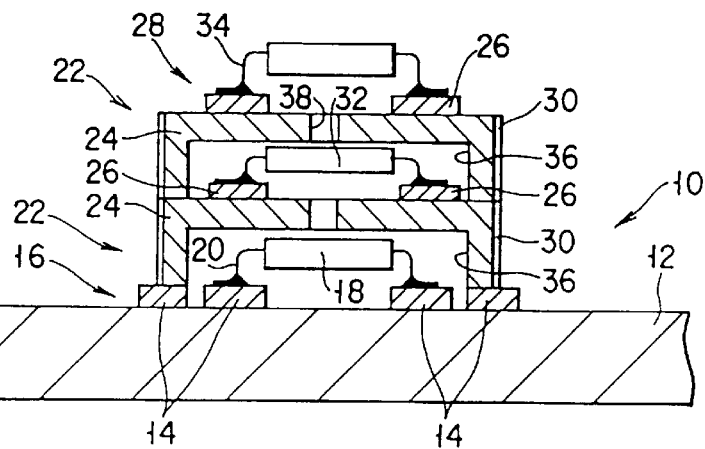
FIG. 10 is a sectional view illustrating a part of a printed-circuit board which is another modification of the present invention.

For example, as shown in FIG. 10, each component unit 22 may be mounted, covering one first electronic component 18, another component unit 22 may be mounted above the component unit 22, covering the second electronic component, and the second conductor patterns 28 of the two component units 22 may be electrically connected to each other. In this case, the electronic components are mounted in three layers, thus at a higher density. Moreover, the component units 22 can be mounted in three or more layers, not in only two layers.

Figure 11:
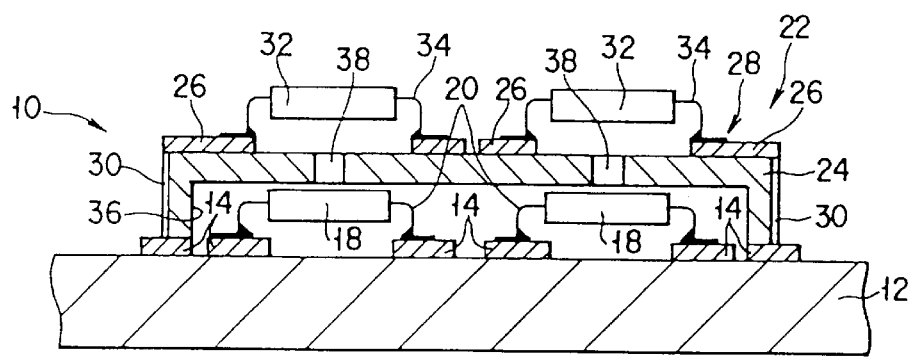
FIG. 11 is a sectional view showing a part of a printed-circuit board which is still another modification of the present invention.

As shown in FIG. 11, each auxiliary printed-wiring board 24 may be large enough to cover two or more first electronic components 18. If so, two or more second electronic components 32 can be mounted on the auxiliary printed-wiring board 24 of each component unit 22.

Figure 12:
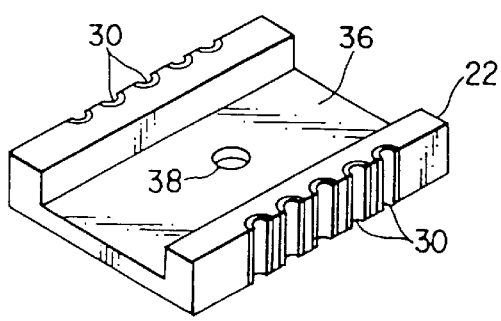
FIG. 12 is a perspective view of a modified component unit.

In the first embodiment, each auxiliary printed-wiring board 24 has four legs. Nonetheless, it is sufficient for the auxiliary printed-wiring board to have at least two legs which extends from two opposite sides, as shown in FIG. 12.

As has been described, the auxiliary printed-wiring boards are arranged above the main printed-wiring board, covering the first electronic components mounted on the main printed-wiring board, and the second electronic components are mounted on the auxiliary printed-wiring boards. Thus, many electronic components can be mounted at a high density. The present invention can therefore provide a printed-circuit board which can be made very small, and an electronic apparatus with the same.

What is claimed is:

1. A printed-circuit board comprising:
   a main printed-wiring board (12) having a first conductor pattern (16);
   a first electronic component (18) mounted on the main printed-wiring board and electrically connected to the first conductor pattern;
   an auxiliary printed-wiring board (24) mounted on the main printed-wiring board, covering the first electronic component, and having a second conductor pattern (28) electrically connected to the first conductor pattern; and
   a second electronic component (32) mounted on the auxiliary printed-wiring board and electrically connected to the second conductor patterns,
   the auxiliary printed-wiring board having an upper surface, two opposite side surfaces, and a lower surface in which a recess for storing the first electronic component is formed,
   the second conductor pattern being formed on the upper and side surfaces of the auxiliary printed-wiring board and including wires which are provided on the side surfaces, connected to the first conductor pattern,
   wherein the auxiliary printed-wiring board (24) has a through hole (38) communicating with the recess (36).

2. A printed-circuit board according to claim 3, wherein the auxiliary printed-wiring board (24) has the through hole (38) further storing a part of the first electronic component (18).

3. A printed-circuit board according to claim 3, wherein the first conductor pattern (16) includes a pad (14) to which the first electronic component (18) is connected, and another pad (14) to which the second conductor pattern is connected.

4. A printed-circuit board comprising:
   a main printed-wiring board (12) having a first conductor pattern (14);
   a first electronic component (18) mounted on the main printed-wiring board and electrically connected to the first conductor pattern; and
   a component unit (22) including an auxiliary printed-wiring board (24) having a second conductor pattern (28) and a second electronic component (32) mounted on the auxiliary printed-wiring board and electrically connected to the second conductor pattern;
   wherein the component unit (22) is mounted on the main printed-wiring board (12), covering the first electronic component (18), and the second conductor pattern (28) is electrically connected to the first conductor pattern,
   the auxiliary printed-wiring board having an upper surface, two opposite side surfaces, and a lower surface in which a recess for storing the first electronic component is formed,
   the second conductor pattern being formed on the upper and side surfaces of the auxiliary printed-wiring board and including wires which are provided on the side surfaces, connected to the first conductor pattern, and
   the auxiliary printed-wiring board (24) of the component unit (22) is large enough to cover a plurality of first electronic components (18) mounted on the main printed-wiring board (12), and a plurality of second electronic components (32) are mounted on the auxiliary printed-wiring board and electrically connected to the second conductor pattern (28).

5. A printed-circuit board according to claim 9, wherein another component unit (22) is mounted on the component unit (22), covering the second electronic component (32) provided on the component unit.

6. A printed-circuit board comprising:
   a main printed-wiring board having a first conductor pattern;
   a first electronic component mounted on the main printed-wiring board and electrically connected to the first conductor pattern;
   an auxiliary printed-wiring board mounted on the main printed-wiring board, covering the first electronic component, and having a second conductor pattern electrically connected to the first conductor pattern; and
   a second electronic component mounted on the auxiliary printed-wiring board and electrically connected to the second conductor pattern;
   the auxiliary printed-wiring board having an upper surface on which the second conductor pattern is formed, a lower surface in which a recess for storing the first electronic component is formed, and a through hole communicating with the recess and storing a part of the first electronic component.

* * * * *

UNITED STATES PATENT AND TRADEMARK OFFICE
CERTIFICATE OF CORRECTION

PATENT NO. : 6,084,780
DATED : July 4, 2000
INVENTOR(S) : Akihiko HAPPOYA

It is certified that error appears in the above-identified patent and that said Letters Patent is hereby corrected as shown below:

Claim 2, Col. 6, line 5, "claim 3" should read --claim 1--.

Claim 3, Col. 6, line 9, "claim 3" should read --claim 1--.

Claim 5, Col. 6, line 43, "claim 9" should read --claim 4--.

Signed and Sealed this

Seventeenth Day of April, 2001

Attest:

NICHOLAS P. GODICI

*Attesting Officer*   *Acting Director of the United States Patent and Trademark Office*